(12) United States Patent
Vigoda et al.

(10) Patent No.: US 8,115,513 B2
(45) Date of Patent: Feb. 14, 2012

(54) CIRCUITS FOR SOFT LOGICAL FUNCTIONS

(75) Inventors: Benjamin Vigoda, Winchester, MA (US); David Reynolds, Scarborough, ME (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 12/716,159

(22) Filed: Mar. 2, 2010

(65) Prior Publication Data
US 2010/0301899 A1    Dec. 2, 2010

Related U.S. Application Data

(60) Provisional application No. 61/156,794, filed on Mar. 2, 2009, provisional application No. 61/156,735, filed on Mar. 2, 2009.

(51) Int. Cl.
*H03K 19/21* (2006.01)
*G06F 17/00* (2006.01)

(52) U.S. Cl. ........... 326/52; 326/104; 326/105; 706/46; 706/52

(58) Field of Classification Search ............ 365/189.15, 365/198, 45; 326/52, 104–108, 115, 127; 706/52, 46
See application file for complete search history.

(56) References Cited

U.S. PATENT DOCUMENTS

| | | | |
|---|---|---|---|
| 5,959,871 A | 9/1999 | Pierzchala | |
| 6,185,331 B1 | 2/2001 | Shi | |
| 6,282,559 B1 | 8/2001 | Helfenstein | |
| 6,584,486 B1 | 6/2003 | Helfenstein | |
| 6,744,299 B2 | 6/2004 | Geysen | |
| 6,762,624 B2 | 7/2004 | Lai | |
| 6,763,340 B1 | 7/2004 | Burns | |
| 7,071,846 B2 | 7/2006 | Moerz | |
| 7,209,867 B2 * | 4/2007 | Vigoda et al. | ........... 702/189 |
| 7,292,069 B2 | 11/2007 | Hannah | |
| 7,418,468 B2 | 8/2008 | Winstead | |
| 7,451,174 B2 * | 11/2008 | Loeliger et al. | ........... 708/801 |
| 7,669,106 B1 | 2/2010 | Farjadrad | |
| 7,769,798 B2 | 8/2010 | Banihashemi | |
| 2002/0089348 A1 * | 7/2002 | Langhammer | ........... 326/38 |

(Continued)

FOREIGN PATENT DOCUMENTS

EP    0614157    10/1999

(Continued)

OTHER PUBLICATIONS

D'Mello, Design Approaches to Field-Programmable Analog Integrated Circuits, Analog Integrated Circuits and Signal Processing, 17(1-2), 1998.

(Continued)

*Primary Examiner* — Vibol Tan
(74) *Attorney, Agent, or Firm* — Occhiuti Rohlicek & Tsao LLP

(57) ABSTRACT

A circuit implementing a soft logical processing network includes an interconnection of analog processing elements, which can include soft logic gates, the soft logic gates including one or more soft logic gates. In some examples, each of the soft logic gates include multiple circuit parts, with each part including an input configured to accept a voltage signal representation of a soft logical quantity, and a conversion section configured to use the accepted voltage representation to form a corresponding current signal. The current signals are combined to form a signal representation of the output of the gate.

12 Claims, 9 Drawing Sheets

U.S. PATENT DOCUMENTS

| | | | |
|---|---|---|---|
| 2004/0136472 A1* | 7/2004 | Vigoda et al. | 375/316 |
| 2005/0165879 A1 | 7/2005 | Nikitin | |
| 2005/0240647 A1 | 10/2005 | Banihashemi | |
| 2006/0026224 A1 | 2/2006 | Merkli | |
| 2007/0188354 A1* | 8/2007 | Vigoda et al. | 341/50 |
| 2008/0065573 A1 | 3/2008 | Macready | |
| 2008/0077839 A1 | 3/2008 | Gross | |
| 2008/0092026 A1 | 4/2008 | Brandman | |
| 2008/0174460 A1 | 7/2008 | Vigoda et al. | |
| 2008/0294970 A1 | 11/2008 | Gross | |
| 2009/0228238 A1 | 9/2009 | Mansinghka | |
| 2010/0033228 A1 | 2/2010 | Gershenfeld | |
| 2010/0301899 A1 | 12/2010 | Vigoda | |
| 2010/0306150 A1* | 12/2010 | Reynolds et al. | 706/46 |
| 2010/0306164 A1* | 12/2010 | Reynolds et al. | 706/52 |

FOREIGN PATENT DOCUMENTS

| | | |
|---|---|---|
| WO | WO2009/137227 | 3/2010 |
| WO | WO2010/101941 | 9/2010 |
| WO | WO2010/101944 | 9/2010 |

OTHER PUBLICATIONS

Eguchi, Simple Design of a Discrete-Time Chaos Circuit Realizing a Tent Map, IEICE Trans. Electron. vol. E83-C(5), May 2000.
Gross, Stochastic Implementation of LDPC Decoders, Signals, Systems and Thirty-Ninth Asilomar Conference 2005.
Hagenauer, A Circuit-Based Interpretation of Analog MAP Decoding with Binary Trellises, Proc. 3rd ITG Conference Source and Channel Coding, Munchen, 2000.
Hagenauer, Analog Decoders and Receivers for High Speed Applications, Proc. of 2002 Int. Zurich Sem. on Broadband Comm, 2002.
Haley, An Analog LDPC Codec Core, Proc. Int. Symp. on Turbo Codes and Related Topics, 2003.
Loeliger, Decoding in Analog VLSI, IEEE Communications Magazine, pp. 99-101, Apr. 1999.
Loeliger, Probability Propagation and Decoding in Analog VLSI, IEEE Transactions on Information Theory, 2001.
Loeliger, Analog Decoding and Beyond, ITW2001, 2pgs., Sep. 2001.
Luckenbill, Building Bayesian Networks with Analog Subthreshold CMOS Circuits, Yale University, 2002.
Lustenberger, On the Design of Analog VLSI Iterative Decoders, ETH No. 13879, Zurich, 2000.
Mansinghka, Stochastic Digital Circuits for Probabilistic Inference, MIT, Cambridge, Nov. 2008.
Mansinghka, Natively Probabilistic Computation, MIT Ph.D. 2009.
Nguyen, A 0.8V CMOS Analog Decoder for an (8,4,4) Extended Hamming Code, Proceedings of the 2004 International Symposium on Circuits and Systems, 2004.
Rapley, Stochastic Iterative Decoding on Factor Graphs, Proc. 3rd Int. Symp. on Turbo Codes and Related Topics, pp. 507-510, 2003.
Schaefer, Analog Rotating Ring Decoder for an LDPC Convolutional Code, ITW2003, Paris, France, Mar. 31-Apr. 4, 2003.
Sequin, Analogue 16-QAM demodulator, Electronics Letters vol. 40, No. 18, 2004.
Stan, Analog Turbo Decoder Implemented in SiGe BiCMOS Technology, U. of Virginia, Dec. 15, 2002.
Tehrani, Stochastic Decoding of LDPC Codes, IEEE Communications Letters 10(10) Oct. 2006.
Vigoda, A Nonlinear Dynamic System for Spread Spectrum Code Acquisition, MIT M.S. Thesis, Aug. 1999.
Vigoda, Analog Logic: Continuous-Time Analog Circuit for Statistical Signal Processing, MIT Ph. D. Thesis, Sep. 2003.
Vigoda, Synchronization of Pseudorandom Signals by Forward-Only Message Passing With Application to Electronic Circuits, IEEE Trans. Info. Theory, Aug. 2006.
Winstead, Analog MAP Decoder for (8,4) Hamming Code in Subthreshold CMOS, ISIT 2001.
Winstead, Analog Iterative Error Control Decoders, U. Alberta, Ph.D. Thesis, 2005.
Winstead, Analog Soft Decoding for Multi-Level Memories, Proc. IEEE Int. Symp. on Multiple-Value Logic (ISMVL'05).
Winstead, Stochastic Iterative Decoders, International Symposium on Information Theory 2005.

\* cited by examiner

FIG. 6    Soft XOR Gate

NAND

| X | Y | Z |
|---|---|---|
| 0 | 0 | 1 |
| 0 | 1 | 1 |
| 1 | 0 | 1 |
| 1 | 1 | 0 |

$Z^+ = X^-Y^- + X^-Y^+ + X^+Y^-$ $Z^- = X^+Y^+$

AND

| X | Y | Z |
|---|---|---|
| 0 | 0 | 0 |
| 0 | 1 | 0 |
| 1 | 0 | 0 |
| 1 | 1 | 1 |

$Z^+ = X^+Y^+$ $Z^- = X^-Y^- + X^-Y^+ + X^+Y^-$

XOR

| X | Y | Z |
|---|---|---|
| 0 | 0 | 0 |
| 0 | 1 | 1 |
| 1 | 0 | 1 |
| 1 | 1 | 0 |

$Z^+ = X^-Y^+ + X^+Y^-$ $Z^- = X^+Y^+ + X^-Y^-$

EQUALS

| X | Y | Z |
|---|---|---|
| 0 | 0 | 1 |
| 0 | 1 | - |
| 1 | 0 | - |
| 1 | 1 | 0 |

$Z^+ = X^+Y^+$ $Z^- = X^-Y^-$

CIRCUITS FOR SOFT LOGICAL FUNCTIONS

CROSS-REFERENCES TO RELATED APPLICATIONS

The application claims the benefit of U.S. Provisional Application Ser. No. 61/156,794, filed Mar. 2, 2009; and U.S. Provisional Patent Application Ser. No. 61/156,735, titled "Circuits for Soft Logical Functions," filed Mar. 2, 2009, the contents of both of which are incorporated herein by reference.

This application is related to U.S. Provisional Patent Application Ser. No. 61/156,721, titled "Signal Mapping," filed Mar. 2, 2009, U.S. Provisional Patent Application Ser. No. 61/293,999, titled "Belief Propagation Processor," filed Jan. 11, 2010, and U.S. Provisional Patent Application Ser. No. 61/156,721, titled "Belief Propagation Processor," filed Mar. 2, 2009. The contents of the above applications are incorporated herein by reference.

STATEMENT AS TO FEDERALLY SPONSORED RESEARCH

This invention was made with government support under Contract HR0011-05-C-0091 awarded by the Defense Advanced Research Projects Agency (DARPA). The government has certain rights in the invention.

BACKGROUND

This specification relates to statistical processing circuits, including for example, circuits that perform soft logical functions.

Statistical inference makes use of statistics to draw inferences based on incomplete or inaccurate information. It may be useful in applications where information needs to be extracted from an observation of data that has been distorted in some way. For example, in communication systems, data transmitted over a communication channel, for example, in the form of radio signals, may be distorted by noise, interference, and/or reflections. Upon receipt of the radio signals, a receiver may employ statistical inference techniques to obtain and process soft (probabilistic) information in order to recover the original transmitted data from the distorted signals.

In some implementations, the processing of soft information may be implemented in the analog domain, for example, by use of analog continuous-time statistical processing circuits that perform soft logical functions such as soft Equals and soft XOR. In some examples, such analog circuits are constructed using traditional translinear circuits (e.g., summers and multipliers) in which probability distributions as represented by current signals may be summed and/or multiplied in the linear domain. Some of these translinear circuits are configured by exploiting the exponential I-V characteristics of particular types of transistors, for example, metal-oxide-semiconductor field-effect transistors (MOSFETs) operating in the sub-threshold region or bipolar junction transistors (BJTs).

SUMMARY

In a general aspect, a circuit implementing a soft logical processing network comprises an interconnection of analog processing elements including soft logic gates, the soft logic gates comprising one or more soft logic gates. Each soft logic gate comprises a plurality of circuit parts, each part including an input configured to accept a voltage signal representation of a soft logical quantity, and a conversion section configured to use the accepted voltage representation form a current signal that depends on the soft logical quantity. In at least a first circuit part of the plurality of circuit parts, the conversion section is configured to convert the accepted voltage representation to provide a corresponding current signal representation of the soft logical quantity. In at least a second circuit part of the plurality of circuit parts, the conversion section is configured to combine the accepted voltage representation and the current signal representation provided by another of the circuit parts to provide a current signal representation. The soft logic gate further comprises a signal combination part coupled to the conversion section of one or more of the circuit parts to form a current signal representation of an output of the soft logic gate.

Aspects can include on or more of the following features.

The voltage signal representations each comprise a substantially log based representation of a corresponding probability value.

The voltage signal representations each comprise a substantially log based representation of a likelihood ratio value.

The output of the soft logic gate includes an XOR function of the soft logical quantity.

At least one of the soft logic gates is configured to implement a soft XOR gate.

In each circuit part, the input is configured to receive a differential voltage signal representation of the soft logical quantity on a plurality of signal lines.

Each signal line is coupled to a corresponding transistor in the conversion section configured to operate in an above threshold mode.

The transistors of the first circuit part are configured to provide a differential current that is substantially proportional to the soft logical quantity represented in the received differential voltage signal.

The transistors of the second circuit part are configured to provide a differential current that is substantially proportional to a product of the soft logical quantity represented in the received differential voltage signal and a quantity represented by the current signal provided by the another of the circuit parts.

The signal combination part is configured to form a current signal representation substantially proportional to a product of the accepted soft logical quantities, whereby the logic gate implements a soft XOR function.

Each conversion section comprises a differential amplifier.

At least some of the differential amplifiers each include a configurable resistive element that controls a characteristic of the differential amplifier.

Some general aspects of the invention relate to a memory including a group of electrical storage elements, each electrical storage elements carrying a respective storage values; a group of conversion elements, each conversion element being coupled to a respective electrical storage element for selectively converting the corresponding storage value to a current signal; and a current combination element for combining the current signals to form an output signal.

Embodiments may include one or more of the following features.

Each conversion element may include a current converter and a switching element. The switching element may be configured to be activated by a selection signal. The memory may further include a control circuit for generating the selection signal according to an input. In some examples, the input includes a specification of a subset of the electrical storage elements to be accessed.

The group of electrical storage elements may include a plurality of charge storage elements each carrying an electrical charge. Each charge storage element may include a capacitive element (e.g., a pair of capacitors). Each conversion element may include a transistor-based circuit element (e.g., a differential amplifier) for selectively converting a respective electrical charge to a corresponding current signal.

The output signal of the memory may provide a continuous valued encoding of the combination of the current signals. In some examples, it represents a combination of the selected storage values. In some examples, the output signal includes a signal encoded by differential currents.

Other features and advantages of the invention are apparent from the following description, and from the claims.

DETAILED DESCRIPTION

Figure 1:
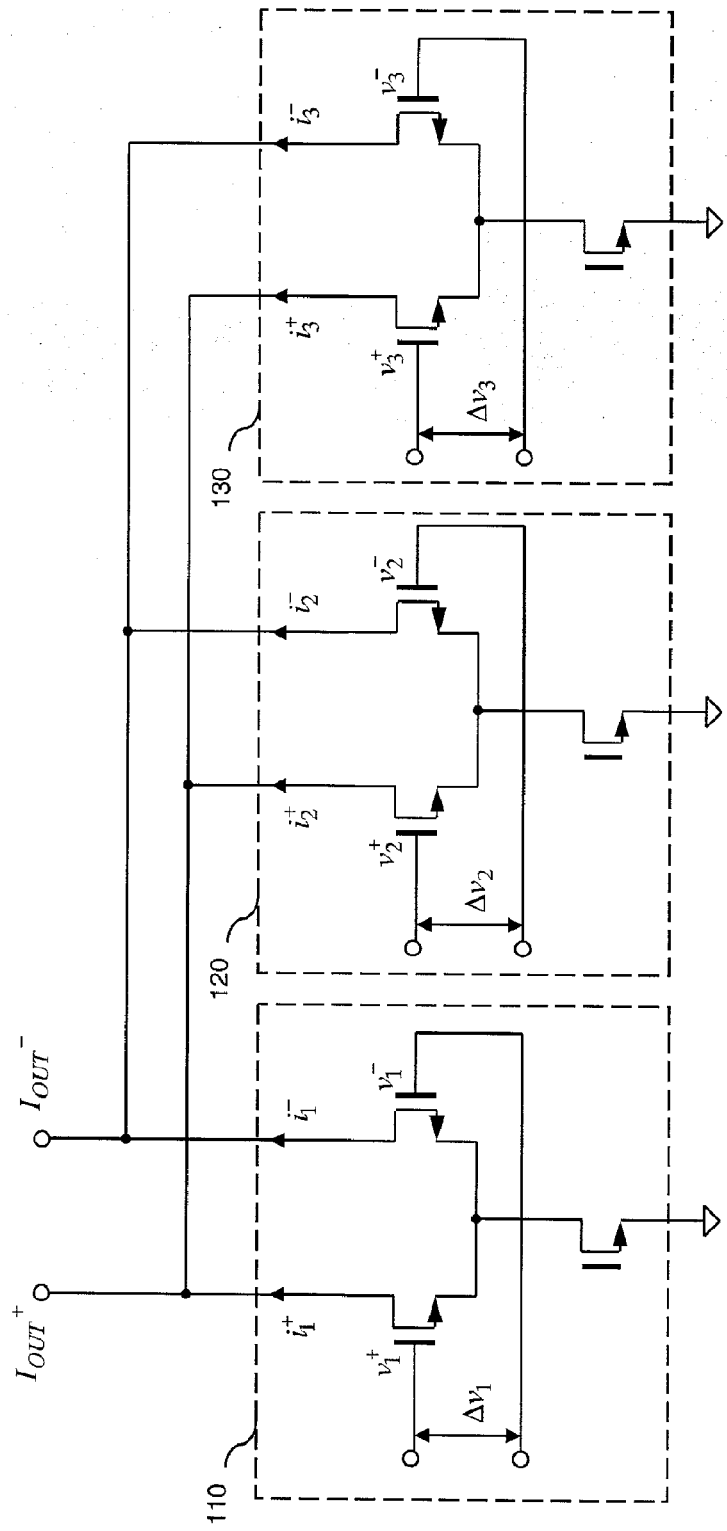
FIG. 1 is a schematic circuit diagram of one embodiment of a soft Equals gate.

Networks of processing elements that implement logical functions for values represented in analog (e.g., substantially continuous) form can be used, for example, in various probabilistic, statistical or belief based processing approaches, which for the sake of discussion in this specification, are referred to a soft logical processing approaches with the values represented being referred to as soft logical quantities. The analog values can represent probabilities or related quantities such as likelihoods, likelihood ratios, beliefs, or intermediate values in computations involving such values. Soft logical processing may be useful in many applications, including, for example, for implementing belief propagation (one form of which is sometimes referred to as the "sum-product" algorithm) that operates by passing messages as analog quantities on a probabilistic graphical model (e.g., factor graphs).

Circuits for continuous-time soft logical processing can be built using analog components. In some examples, probability distributions are represented in such circuits by electrical currents or voltages that can be processed in the linear domain (i.e., using substantially proportional relationships between probabilities and voltage and/or current values) by addition and/or multiplication operations implemented in a network of analog processing elements. The discussion below focuses on analog processing elements that are suitable to form nodes in a soft logical processing network, for instance, each implementing soft logical operations, including soft Equals, soft XOR, soft AND, and soft OR, (collectively "soft logic gates" or "soft gates"), which accept representations of multiple soft probabilities (e.g., in one analog representation) and output a representation of the result as a soft probabilities (e.g., in the same or a different representation).

In some examples, it may be useful to process probability based quantities in the log domain, or some other continuous and generally monotonic transformed domain, rather than a linear domain. For example, the analog signals inputs and outputs of the circuit elements correspond approximately to the log likelihood ratio (LLR) representation of probability distributions. Other compressive and/or sigmoidal transformations of probabilities can also be used.

In some examples, as discussed below, soft logical quantities are represented as using multiple analog signals, for instance, as differential currents or differential voltages using to signal links for each quantity, or in some examples, using greater than two signal links.

The following description provides some examples of soft gate circuits that are configured using this approach.

1 Soft Equals Gates

1.1 Soft Equals Gates with Variables of Binary Values

In a fully digital circuit that processes binary data, the inputs and outputs of a logical gate are 0 or 1. With an analog logic gate (or soft gate), the inputs and outputs represent probabilities or likelihoods and can range between 0% and 100% with the constraint that the probabilities for all possible outputs sum to 100%.

In some embodiments, a three-variable soft Equals gate performs the following function:

| X | Y |   | Z |   |   |
|---|---|---|---|---|---|
| 1 | 1 | → | 1 | $P(Z=1) = \gamma \cdot P(x=1) \cdot P(y=1)$ | (1a) |
| 0 | 0 | → | 0 | $P(Z=0) = \gamma \cdot P(x=0) \cdot P(y=0)$ | (1b) | where x and y are the input variables, z is the output variable, and γ is the normalization factor such that $P(Z=0)+P(Z=1)=1$. Here, each variable assumes two possible values, i.e., 0 and 1, and the probability distribution of each variable (such as variable x) is represented, for example, by $P(x=0)$, $P(x=1)$. In some examples, the two input variable x and y may represent two independent observers, each of which yields an estimate for output variable z.

In some examples, a soft gate in a factor graph is bidirectional. More specifically, the edges leading into or away from the soft gate is in fact bi-directional, and a bi-directional soft gate over 3 variables can be implemented using 3 uni-directional soft gates, with each gate accepting two input variables to generate an output variable.

One implementation of the above soft Equals gate makes use of translinear multipliers, where the probability distributions of the input variables are multiplied as current encoded signals in the circuit to form the output $P(Z=0)$ and $P(Z=1)$.

Another implementation of the soft Equals gate makes use of current summation in the log likelihood ratio (LLR) regime. More specifically, given equations (1a) and (1b), one can obtain:

$$\frac{P(Z=0)}{P(Z=1)} = \frac{P(x=0) \cdot P(y=0)}{P(x=1) \cdot P(y=0)} \quad (2)$$

Transforming equation (2) to the log domain gives the following:

$$\log\left(\frac{P(Z=0)}{P(Z=1)}\right) = \log\left(\frac{P(x=0)\cdot P(y=0)}{P(x=1)\cdot P(y=1)}\right) \quad (3)$$
$$= \log\left(\frac{P(x=0)}{P(x=1)}\right) + \log\left(\frac{P(y=0)}{P(y=1)}\right)$$

By using "LLR" to denote the log likelihood ratio of a binary variable, such as $$LLR_x = \log\left(\frac{P(x=0)}{P(x=1)}\right)$$

for variable x, equation (3) can be re-written as:

$$LLR_Z = LLR_x + LLR_y \quad (4)$$

In other words, the LLR of output variable Z can be obtained by summing the LLRs of input variables x and y.

Now consider, in a more general case, an output variable Z that is conditioned on N(N≧2) independent observers, each of which produces an estimate for P(Z=0), denoted as $p_1, \ldots, p_N$. Given the following observation, $$\frac{P(Z=0)}{P(Z=1)} = \frac{p_1 p_2 \cdots p_N}{(1-p_1)(1-p_2)\cdots(1-p_N)} \quad (5a)$$

the LLR of variable Z can be obtained as:

$$\log\left(\frac{P(Z=0)}{P(Z=1)}\right) = \log\left(\frac{p_1 p_2 \cdots p_N}{(1-p_1)(1-p_2)\cdots(1-p_N)}\right) \quad (5b)$$
$$= \log\left(\frac{p_1}{1-p_1}\right) + \log\left(\frac{p_2}{1-p_2}\right) + \cdots + \log\left(\frac{p_N}{1-p_N}\right),$$

which is essentially $$LLR_Z = \sum_{i=1}^{N} \log\left(\frac{p_i}{1-p_i}\right) = \sum_{i=1}^{N} LLR_i \quad (6)$$

In other words, the LLR of the output variable Z can be obtained by summing the individual LLRs of the observers. This can be implemented using summation circuits in which the circuit inputs and output represent (or approximate) the input LLRs and output LLR, respectively.

FIG. 1 shows one example of a circuit structure 100 operable to perform a four-variable (i.e., three-input) soft Equals function using current summation. Note that, in factor graph-based applications, a four-variable soft Equals gate would involve computing all four of the variables, each using the other three variables. These four computations can be respectively implemented in a set of 4 circuits, each circuit accepting three variables to generate the fourth variable. The examples illustrated below implements one of the four circuits. The other three circuits can be configured using similar techniques but changing the input and output variables.

Here, the circuit 100 includes three differential pair circuits 110, 120, and 130, each of which accepts a respective input signal (in the form of differential voltages) to form a signal (in the form of differential currents) that is substantially proportional to the input. For example, in circuit 110, a differential voltage signal $\Delta v_1$ (i.e., $v_1^+ - v_1^-$) is provided as input to circuit 110 to generate a differential current signal $\Delta i_1$ (i.e., $i_1^+ - i_1^-$) that is in substantial proportion to $\Delta v_1$. The current signals of all three circuits 110, 120, and 130 are then summed to generate a circuit output $\Delta I_{OUT} \propto (\Delta v_1 + \Delta v_2 + \Delta v_3)$.

In this circuit 100, each of the three input differential voltage signal may represent (e.g., has an amplitude that is scaled to) an individual input LLR. As a result, the output $\Delta I_{OUT}$ may represent an output LLR that is the sum of the three input LLRs as shown in equation (6).

Note that, when configured to accept input and output both in the LLR form, the circuit 100 effectively operates as a soft Equals gate by current summation without necessarily requiring multiplication. This may offer several advantages over traditional soft Equals gate configured using translinear approach. For example, the present approach allows for increased fan-in (i.e., the number of inputs for a logical gate) without necessarily having to increase supply voltage $V_{DD}$ or the number of elements (e.g., transistors) to be used in the circuit. In comparison, some translinear soft Equals gates may require designers to either 1) stack transistors up in voltage or 2) fold over using current mirrors in order to add fan-in. In the first case, the number of transistors needed grows faster in the translinear approach than the present approach. In the second case, current mirrors can be a bottleneck for speed, for example, when there are small currents due to their capacitance.

Another advantage of the present approach relates to the simplicity of the hardware configuration because current summing is effectively one of the most inexpensive and accurate analog operations available. As soft Equals gates are prevalent in statistical processing (e.g., factor graph based processing), efficient design of soft Equals gates allows for improved overall circuit efficiency.

A third advantage is the close approximation of actual transfer function of the soft Equals gate to the designed mathematical transfer function (i.e. a sum of LLRs), because currents add essentially linearly in the circuit with Kirckoff's Current Law (KCL).

Figure 2:
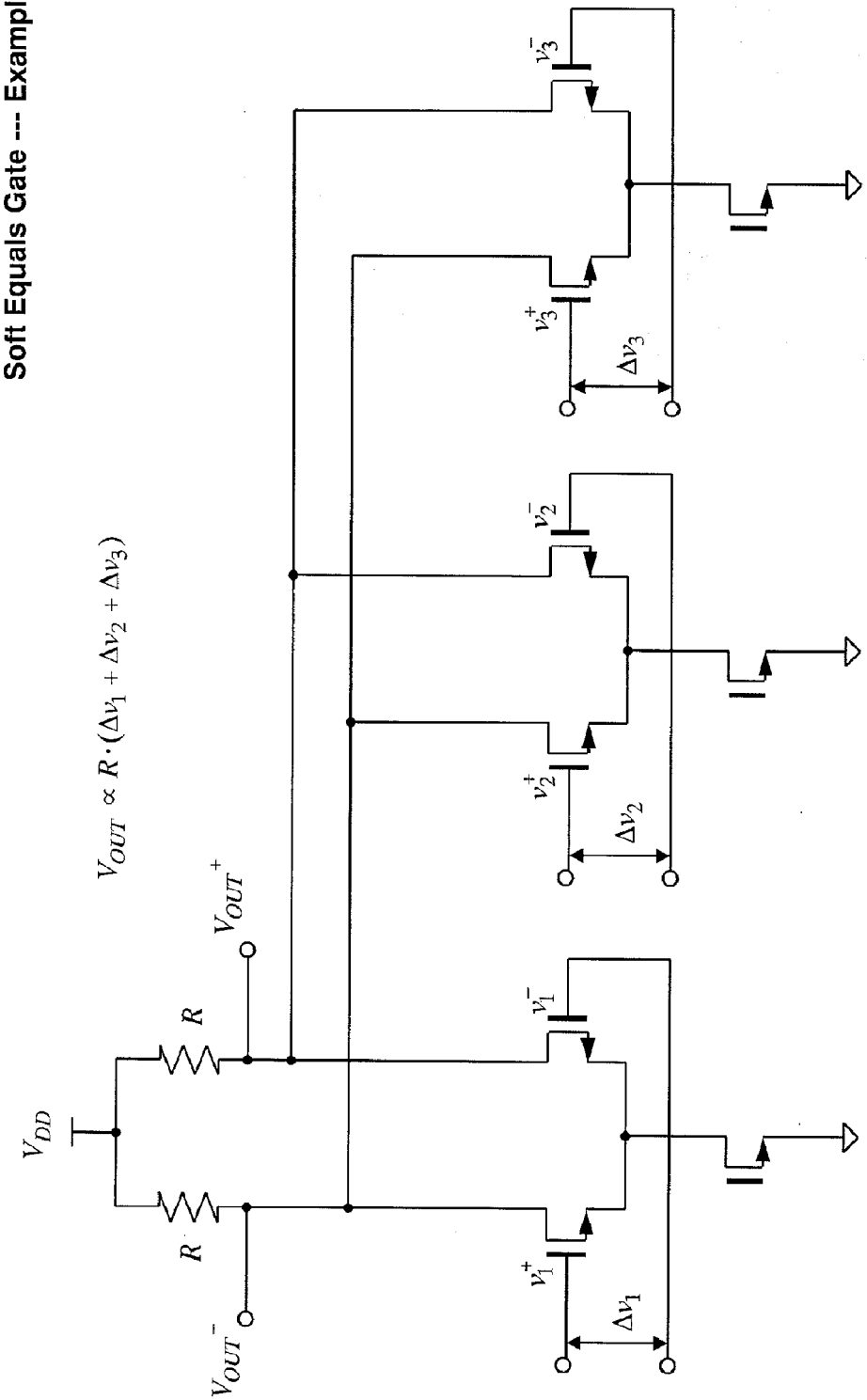
FIG. 2 is a schematic circuit diagram of a second embodiment of a soft Equals gate.

FIG. 2 shows another example of a circuit structure 200 operable to perform a four-variable soft Equals function. Here, instead of outputting a differential current signal $\Delta I_{OUT}$, the circuit 200 uses a pair of resistive loads R to form a differential voltage signal $\Delta V_{OUT}$ representing the output LLR. The three input LLRs are again respectively represented by differential voltage signals $\Delta v_1$, $\Delta v_2$, and $\Delta v_3$.

Figure 3:
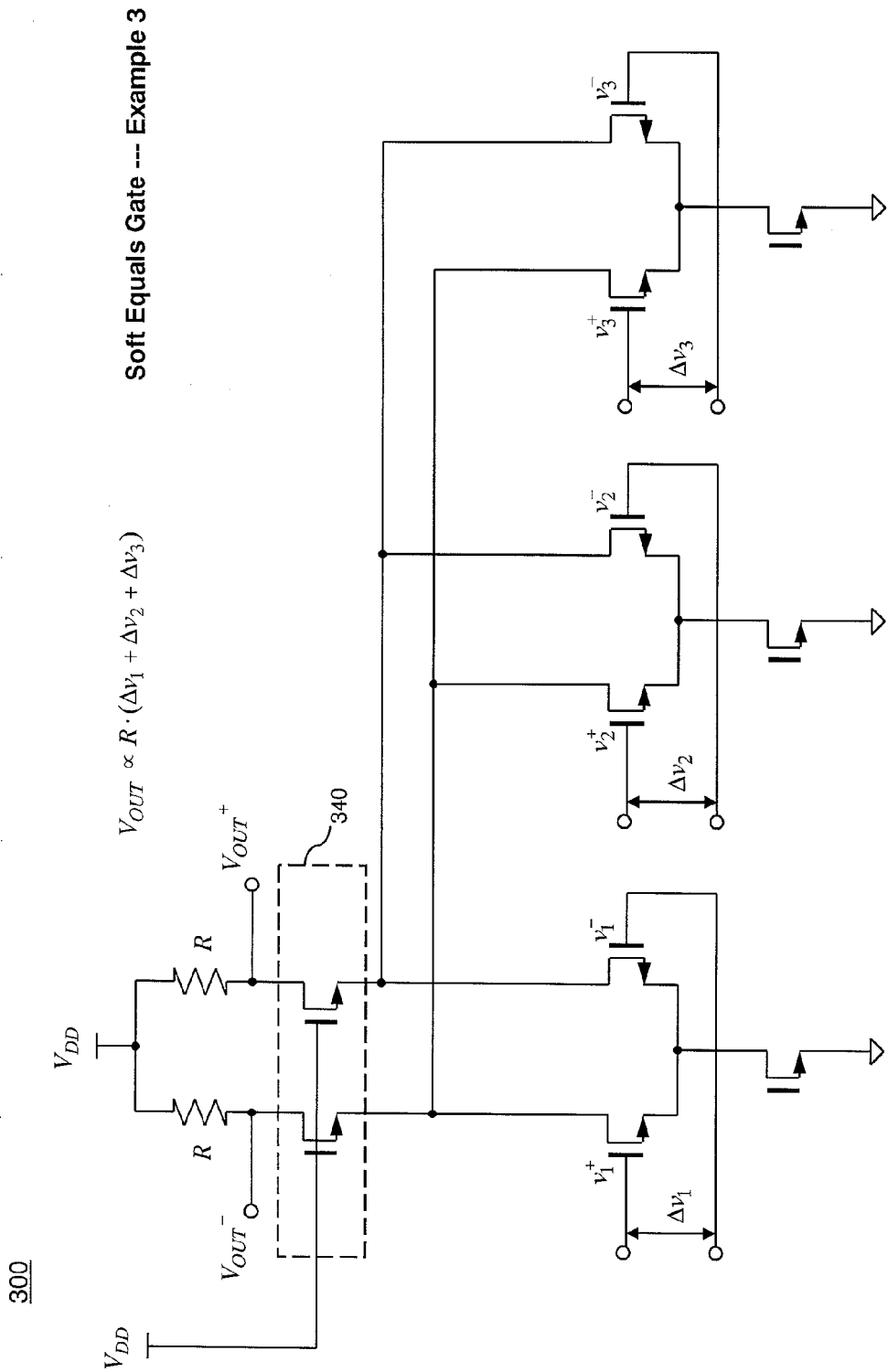
FIG. 3 is a schematic circuit diagram of a third embodiment of a soft Equals gate.

FIG. 3 shows a third example of a circuit structure 300 operable to perform a four-variable soft Equals function. Here, the circuit 300 accepts three differential voltage signals representing three input LLRs to generate an output differential voltage signal representing the output LLR. The use of a cascode structure 340 at the output terminal may, in some applications, improve certain aspects of circuit performance, such as improve input-output isolation and increase circuit bandwidth.

Note that FIGS. 1-3 are schematic diagrams of circuits (configured using analog components) that are operable as soft Equals gates. Various alternatives circuit designs are possible, including, for example, circuits of similar structure to the ones described above but having additional active and/or non-active circuit elements (such as resistors and transistors).

Figure 4:
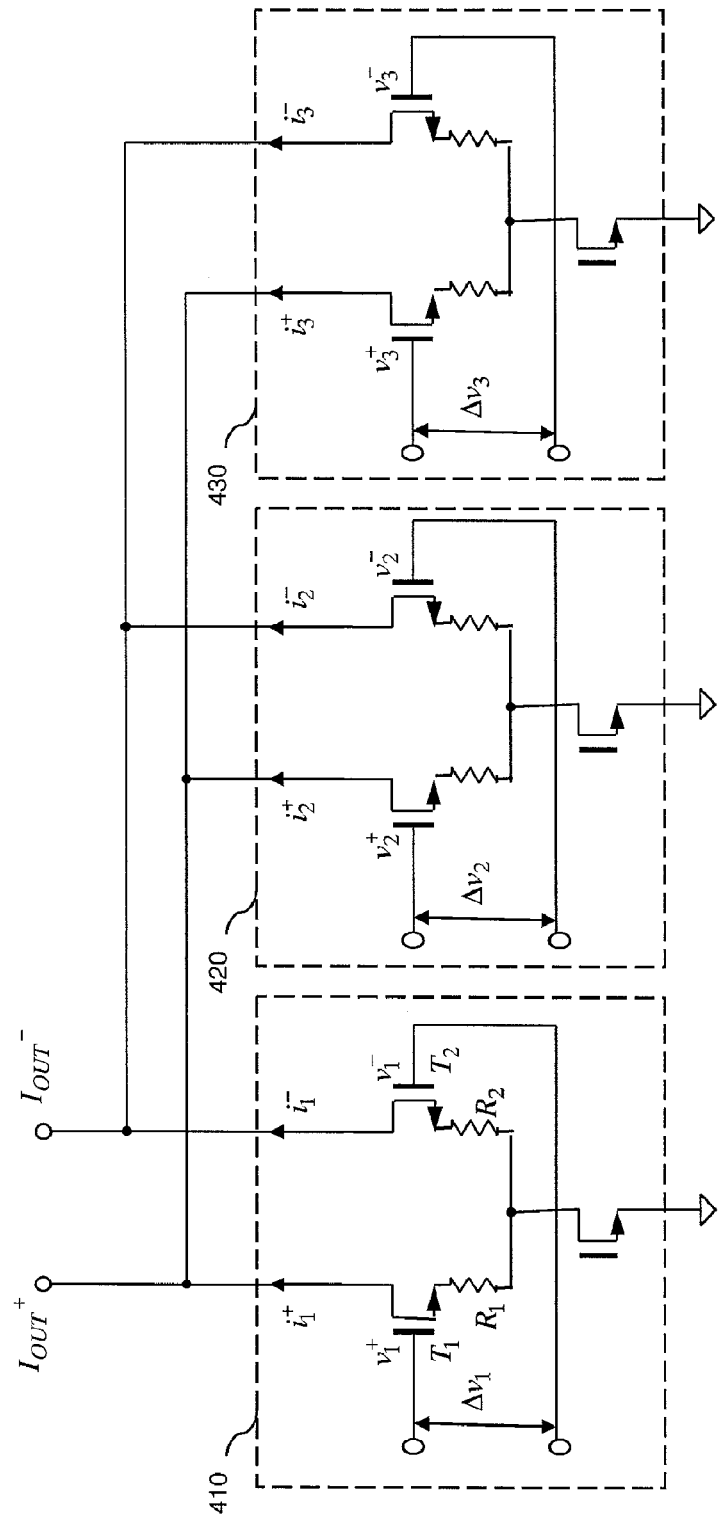
FIG. 4 is a schematic circuit diagram of a fourth embodiment of a soft Equals gate.

FIG. 4, for example, shows a variant of the circuit structure 100 shown in FIG. 1. In this example, each one of the differential pair circuits (e.g., circuit 410) includes a pair of fixed resistors $R_1$ and $R_2$ respectively coupled to transistors $T_1$ and $T_2$. The presence of the resistors in the differential pair circuit increases the linearity of the circuit transfer function in certain applications. Such modification can be similarly applied to the circuit structures shown in FIG. 2 and FIG. 3.

Figure 5:
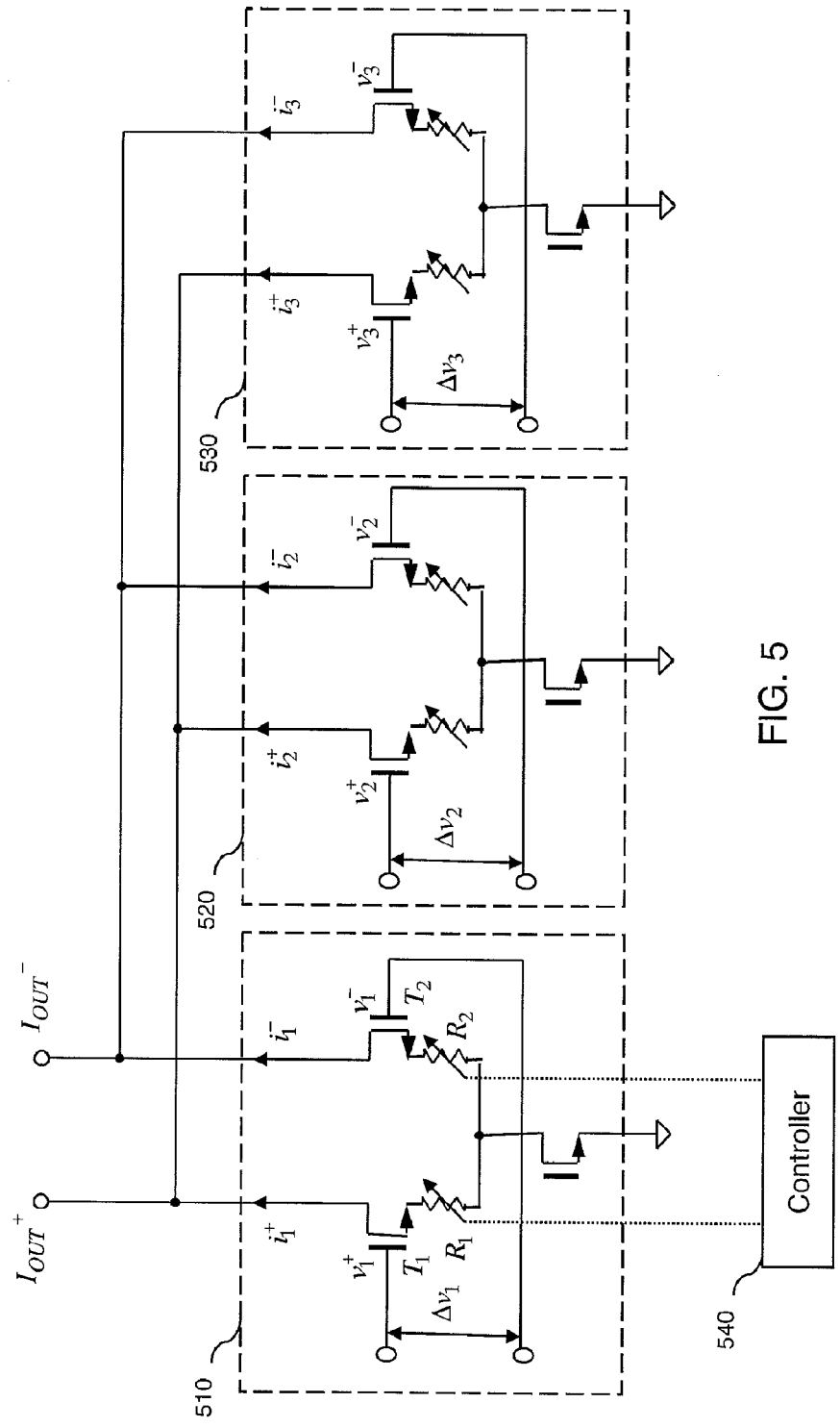
FIG. 5 is a schematic circuit diagram of a fifth embodiment of a soft Equals gate.

FIG. 5 shows another example of a circuit 500 operable to perform a four-variable soft Equals function. Here, each one of the differential pair circuits (e.g., circuit 510) includes a pair of configurable resistive elements, such as $R_1$ and $R_2$ respectively coupled to transistors $T_1$ and $T_2$. The configurable resistive elements may be passive resistors (e.g., variable resistors), or alternatively, be active elements that function essentially like resistors. One example of an active element suitable for use here is a MOS transistor biased in the triode region acting as a resistor. In some examples, the configurable resistive elements $R_1$ and $R_2$ may have variable I-V characteristic that is controllable by external signals, for example, signals provided by a controller 540. In some applications, the configurability of the resistive elements enables the effective transfer function of the differential pair circuit and/or the entire circuit 500 to be tuned as desired.

Some other examples of soft Equals gates are described in U.S. Provisional Patent Application Ser. No. 61/156,735, titled "Circuits for Soft Logical Functions," filed on Mar. 2, 2009.

1.2 Soft Equals Gates with Variables of M-ary Values

Although the above description illustrates soft Equals gates that process variables of binary values, the general techniques are readily extendible to the processing of m-ary variables, i.e., variables that can have m number of possible values where m>2. For purposes of illustration, one example of circuits operable as soft Equal gates that handle m-ary variables are briefly described below.

Assume a random variable Z that may take on m possible values, say 1, . . . , m. The probability of Z having each of these values may be obtained using N independent observers, each of which provides estimates of these values. For instance, the i-th observer givers a probability distribution denoted as $p_i(Z=1)$, $p_i(Z=2)$, . . . , $p_i(Z=N)$.

The probability of variable Z being 1 can be obtained:

$$P(Z=1)=\gamma \cdot p_1(Z=1)p_2(Z=1)\ldots p_N(Z=1) \quad (7)$$

and similarly for P(Z=2), and etc,
where $\gamma$ is the normalization factor representing $$\gamma = \frac{1}{\sum_{k=1}^{m} p_1(Z=k)p_2(Z=k)\cdots p_N(Z=k)}. \quad (8)$$

Select the probability of one variable, for example, P(Z=m), as a reference. For any k value where $1 \leq k < m$, the log likelihood of P(Z=k) with respect to P(Z=m) can then be obtained as the following $$LLR_{Z_k} = \log\left(\frac{P(Z=k)}{P(Z=m)}\right) = \sum_{i=1}^{N} \log\left(\frac{p_i(Z=k)}{p_i(Z=m)}\right) = \sum_{i=1}^{N} LLR_{i,k} \quad (9)$$

where $LLR_{Z_k}$ represents the LLR of variable Z having value k with respect to the reference m, $LLR_{i,k}$ represents the LLR of the i-th observer having value k with respect to the reference m. Note that, similar to equation (6), equation (9) can be implemented by summation, for example, using circuits similar to the examples of FIG. 1-5 to obtain the $LLR_{Z_k}$ for each one of the m−1 number of k values.

2 Soft XOR Gates 2.1 Soft XOR Gates with Variables of Binary Values

In some embodiments, a binary XOR gate in a fully digital circuit performs the mod-2 addition function. In the analog domain, a three-variable soft XOR gate may perform the following function:

| X | Y | | Z | | |
|---|---|---|---|---|---|
| 1 | 1 | → | 0 | $P(Z=1) = P(x=0) \cdot P(y=1) + P(x=1) \cdot P(y=0)$ | (10a) |
| 0 | 0 | → | 0 | $P(Z=0) = P(x=0) \cdot P(y=0) + P(x=1) \cdot P(y=1)$ | (10b) |
| 0 | 1 | → | 1 | | |
| 1 | 0 | → | 1 | | | where x and y are the input variables and z is the output variable. Here, each variable assumes two possible values, i.e., 0 and 1. This three-variable soft XOR function may also be denoted as Z=x⊕y.

The soft XOR gate described by equations (10a) and (10b) may be implemented in the LLR regime using the following technique.

Given an LLR of a variable x, i.e., $$LLR_x = \log\left(\frac{P(x=0)}{P(x=1)}\right),$$

the differential probability (i.e., P(x=0)−P(x=1)) of this variable is in fact equal to tan h($LLR_x/2$), as shown below:

$$\tanh(LLR_x/2) = \frac{e^{LLR_x/2} - e^{-LLR_x/2}}{e^{LLR_x/2} + e^{-LLR_x/2}} \quad (11)$$

$$= \frac{1 - e^{-LLR_x}}{1 + e^{-LLR_x}}$$

$$= \frac{1 - \frac{P(x=1)}{P(x=0)}}{1 + \frac{P(x=1)}{P(x=0)}}$$

$$= \frac{P(x=0) - P(x=1)}{P(x=0) + P(x=1)}$$

$$= P(x=0) - P(x=1)$$

Similarly, for variable y, one may obtain $$\tan h(LLR_y/2) = P(y=0) - P(y=1) \quad (12),$$

and for variable Z, one may obtain $$\tan h(LLR_Z/2) = P(Z=0) - P(Z=1) \quad (13)$$

Note that, tan h($LLR_Z/2$) can be rewritten using equations (10a) and (10b), as the following:

$$\tanh(LLR_Z/2) = P(Z=0) - P(Z=1) \quad (14)$$

$$= (P(x=0) \cdot P(y=0) + P(x=1) \cdot P(y=1)) -$$

$$(P(x=0) \cdot P(y=1) + P(x=1) \cdot P(y=0))$$

$$= (P(x=0) - P(x=1)) \cdot (P(y=0) - P(y=1))$$

which, by applying equation (11) and (12), further yields $$\tan h(LLR_Z/2) = \tan h(LLR_x/2) \cdot \tan h(LLR_y/2) \quad (15)$$

Thus, given $LLR_x$ and $LLR_y$ as inputs to a soft XOR gate, the output $LLR_Z$ can be obtained as $$LLR_Z = 2 \cdot \tan h^{-1}((\tan h(LLR_x/2) \cdot \tan h(LLR_x/2)) \quad (16)$$

This describes a theoretical three-variable soft XOR function in the LLR domain.

Figure 6:
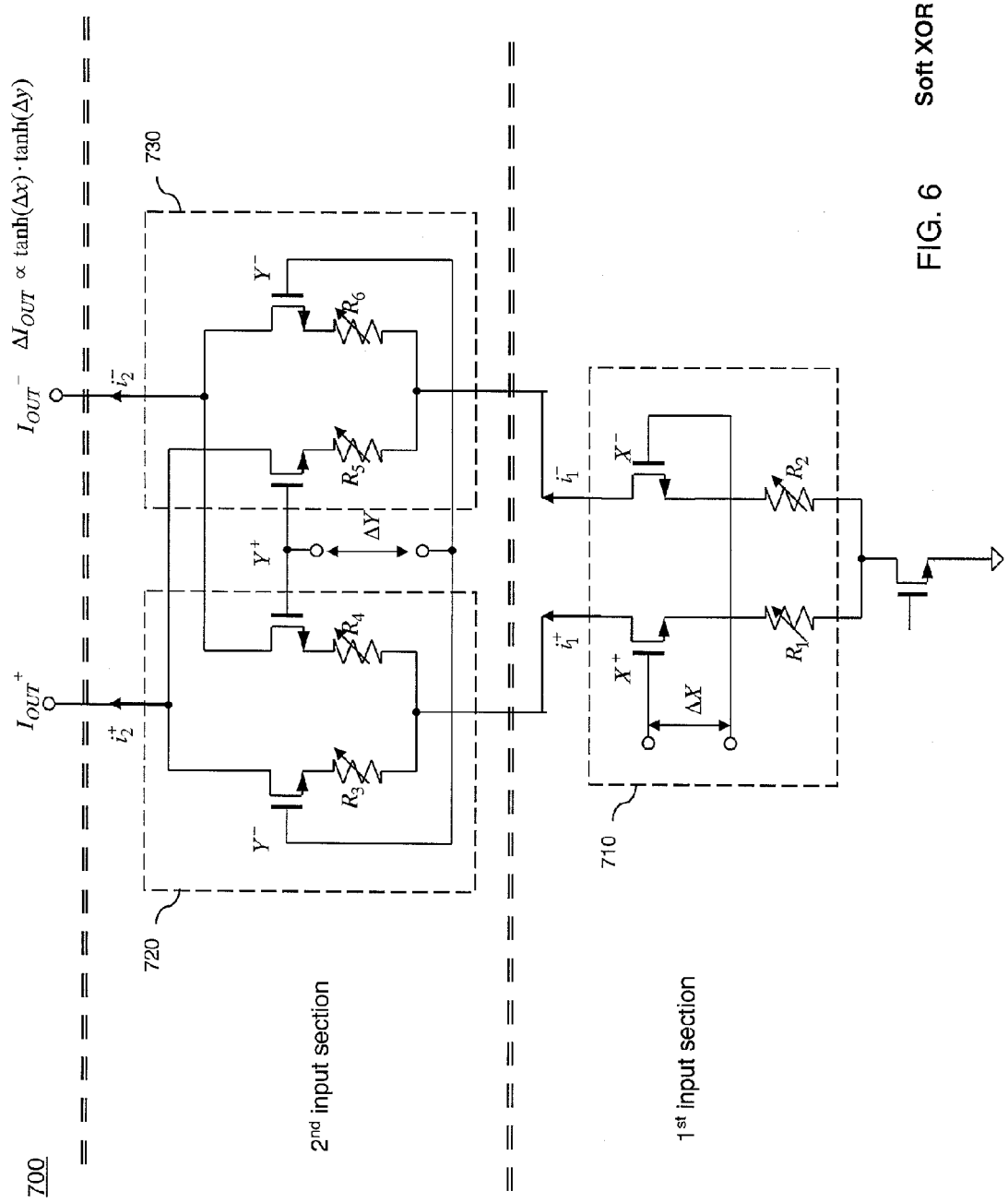
FIG. 6 is a schematic circuit diagram of one embodiment of a soft XOR gate.

FIG. 6 illustrates one example of a circuit 700 operable to approximate the theoretical soft XOR function shown in equation (16). Here, the gate 700 accepts two differential input signals $\Delta x$ and $\Delta y$ (both in the voltage form) to generate an output differential signal $\Delta I_{OUT}$ (in the current form). Structurally, the gate 700 includes two input sections. The first input section includes a differential amplifier 710 that accepts a first differential voltage input $\Delta x$ to form a differential current signal $\Delta i_1$ (i.e., $i_1^+ - i_1^-$) that approximates a tan h (or sigmoid) function of the first input, i.e., $\Delta i_1 \propto \tan h(\Delta x)$. The second input section includes a pair of differential amplifiers 720 and 730, each of which accepts a second differential voltage input $\Delta y$. The outputs of the pair of differential amplifiers are connected such that the differential output $\Delta I_{OUT}$ (i.e., $i_2^+ - i_2^-$) of this circuit 700 approximates a tan h (or sigmoid) function of the second input, i.e., $\Delta i_{OUT} \propto \tan h(\Delta y)$. Note that each of the transistors in the second input section also receives at its source terminal a respective one of the differential currents $i_1^+, i_1^-$ generated by the differential amplifier 710. Thus, the differential output $\Delta I_{OUT}$ of the circuit 700 is also scaled by $\Delta i_1$, which gives, $$\Delta i_{OUT} \propto \tan h(\Delta x) \cdot \tan h(\Delta y) \quad (17).$$

For inputs and outputs that fall in the typical operation range of the circuit 700, the tan $h^{-1}$ function may be approximated by a linear function whose output grows approximately in proportion to the input. In other words, $\tan h^{-1}(v) \approx k \cdot v$. Thus, the gate output $\Delta I_{OUT}$ can also be viewed as the following:

$$\Delta i_{OUT} \propto \tan h^{-1}(\tan h(\Delta x) \cdot \tan h(\Delta y)) \quad (18)$$

Note the similarity of equation (18) to equation (16). In fact, when the differential inputs $\Delta x$ and $\Delta y$ of circuit 700 represent (e.g., is provided with amplitude in proportion to) the $LLR_x/2$ and $LLR_y/2$, respectively, the differential output $\Delta I_{OUT}$ of the circuit 700 approximates the $LLR_Z$ that is the soft XOR function of the $LLR_x/2$ and $LLR_y/2$ as defined by equation (16). In other words, the actual transfer function of the circuit 700 approximates the theoretical soft XOR function in the LLR domain.

In some cases, the approximation of the actual circuit transfer function to the theoretical soft XOR function can be improved, for example, by controlling the resistive elements in the circuit. For example, each of the differential amplifiers 710, 720, and 730 of the circuit includes a pair of variable/controllable resistive elements (such as $R_1$ and $R_2$) whose resistivity may affect the transfer function of the differential amplifier. By varying the resistivity of selected or all of the resistive elements, the actual circuit transfer function may be configured to be a close approximation of the theoretical soft XOR function in the LLR domain.

For the differential amplifier 710, when $R \to 0$, its transfer function behaves as a sigmoid function, whereas when R becomes greater than $$\frac{1}{G_m}$$

of the differential amplifier, the transfer function of the differential amplifier 710 becomes essentially a capped linear function. In some applications, it is useful to tune the resistivity of the individual resistive elements such as $R_1$ and $R_2$ to achieve a desired transfer function for a particular differential amplifier. In some applications, it is also useful to control the resistive elements in more than one differential amplifier such that the circuit 700 may provide a combined transfer function that is a closer approximation to the theoretical soft XOR gate in the LLR domain. The resistive elements in the gate circuit may take various forms, including for example, passive resistors and transistors in certain configurations that may function as resistors.

Note that, similar to the soft Equals gate, the soft XOR gate described herein may also be configured in many alternative ways. One example is a variant of circuit 700 that, instead of producing a differential current output signal, generates a differential voltage output signal by using a pair of resistive loads at the output terminals.

The above description illustrates circuits operable as one circuit element of a 3-variable soft XOR gate implemented in the LLR domain. In some examples, a larger N-variable (N>3) soft XOR gate may be implemented based on a functionally equivalent collection of small 3-variable soft XOR gates as described below.

Assume $x_1, x_2, \ldots, x_{N-1}$ are N−1 number of independent observers that each estimates the value of variable $x_N$. An N-variable soft XOR gate performs the mod-2 sum operation on these N variables as follows:

$$x_N = x_1 \oplus x_2 \oplus \ldots \oplus x_{N-1} \quad (19)$$

By introducing a new set of variables $y_2, \ldots, y_{N-1}$, equation (19) can be represented by a new set of equations each of which involves only three variables:

$$y_2 = x_1 \oplus x_2 \quad (20)$$

$$y_3 = y_2 \oplus x_3$$

$$y_4 = y_3 \oplus x_4$$

$$\vdots$$

$$y_{N-1} = y_{N-2} \oplus x_{N-1}, \text{ where } y_{N-1} = x_N$$

In hardware configurations, this means that a N-variable soft XOR can be decomposed into as a chain (or a tree) of core modules, each core module being a 3-variable soft XOR that produces an output signal based on two input signals. When implemented in the LLR domain, an N-variable soft XOR may be constructed using a series of the 3-input soft XOR gates shown in FIG. 6. For example, based on equation (15), one may obtain $$\tan h(LLR_{x_N}/2) = \tan h(LLR_{x_1}/2) \cdot \tan h(LLR_{x_2}/2) \ldots \tan h(LLR_{x_{N-1}}/2) \quad (21)$$

An N-variable soft XOR may be configured to generate an output differential signal representing the $LLR_{x_N}$ by connecting N−1 input sections in a cascade fashion, where each input section accepts a differential voltage input representing a corresponding input $LLR_{x_i}$ ($1 \leq i < N$). Using this approach, the fan-in of a soft XOR circuit can be efficiently increased by introducing additional 3-variable soft XOR gates into the circuit.

3 Other Types of Soft Gates

The methods and techniques described above are not limited to soft Equals and soft XOR gates, and can be readily extendible to other types of operations such as soft OR and soft AND. Some examples of three-variable soft gate operations may be described by the following equations, which illustrates one circuit element of the three-variable soft gate that accepts X and Y as two input variables to generate Z as output variable:

| Operation | Output |
|---|---|
| X AND Y | $P(Z=0) = P(X=0) \cdot P(Y=0) + P(X=0) \cdot P(Y=1) + P(X=1) \cdot P(Y=0)$ |
|  | $P(Z=1) = P(X=1) \cdot P(Y=1)$ |
| X OR Y | $P(Z=0) = P(X=0) \cdot P(Y=0)$ |
|  | $P(Z=1) = P(X=0) \cdot P(Y=1) + P(X=1) \cdot P(Y=0) + P(X=1) \cdot P(Y=1)$ |

Figure 9:
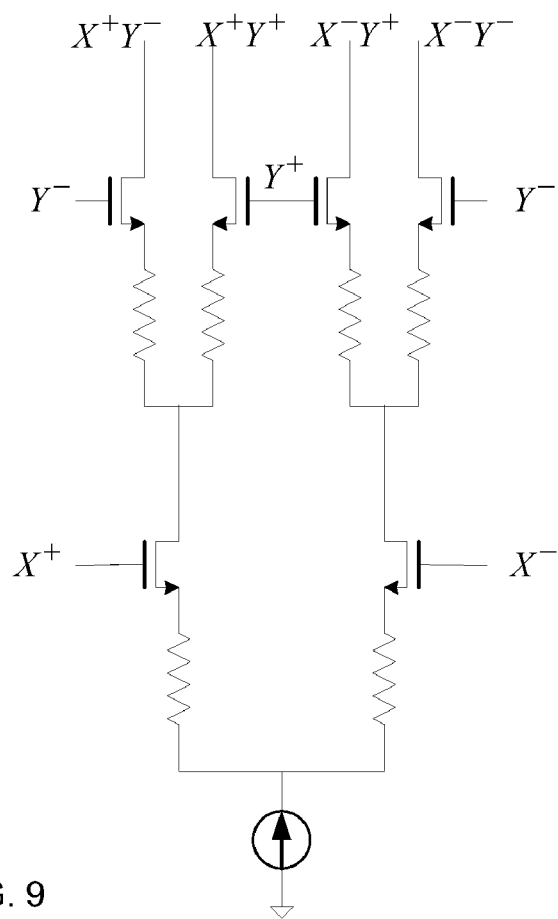
FIG. 9 is a diagram of embodiments of other types of soft gates.

In some applications, various types of soft gates can be configured using the techniques described above. FIG. 9 shows a diagram of a core circuit that can be re-configured to implement different soft gates. For example, the circuit includes four output leads, each having a current corresponding to a multiplication of a pair of inputs (i.e., $X^+Y^-$, $X^+Y^+$, $X^-Y^+$, $X^-Y^-$). The output of a soft gate can be obtained by combining the proper set of output leads. For example, the $Z^+$ of a NAND gate can be formed by connecting the $X^+Y^-$, $X^-Y^+$, $X^-Y^-$ leads, and the $Z^-$ of a NAND gate can be formed by the $X^+Y^+$ lead. Other soft gates can be configured using similar approaches.

4 Applications

4.1 Analog Memory

One application of the soft gates described herein relates to data storage, for example, for retrieving storage values from an analog memory. In some embodiments, in reading an analog memory device having a set of memory cells, it may be useful to perform soft Equals gate operations on the retrieved values of selected subsets of the memory cells. As aforementioned, one way to perform soft Equals gate makes use of current summation in the LLR domain. In the memory application, this can be done by forming current signals to represent the storage values of a selected set of memory cells and then summing the current signals to generate an output (the output may be further provided to a soft XOR gate for error correction).

Figure 7:
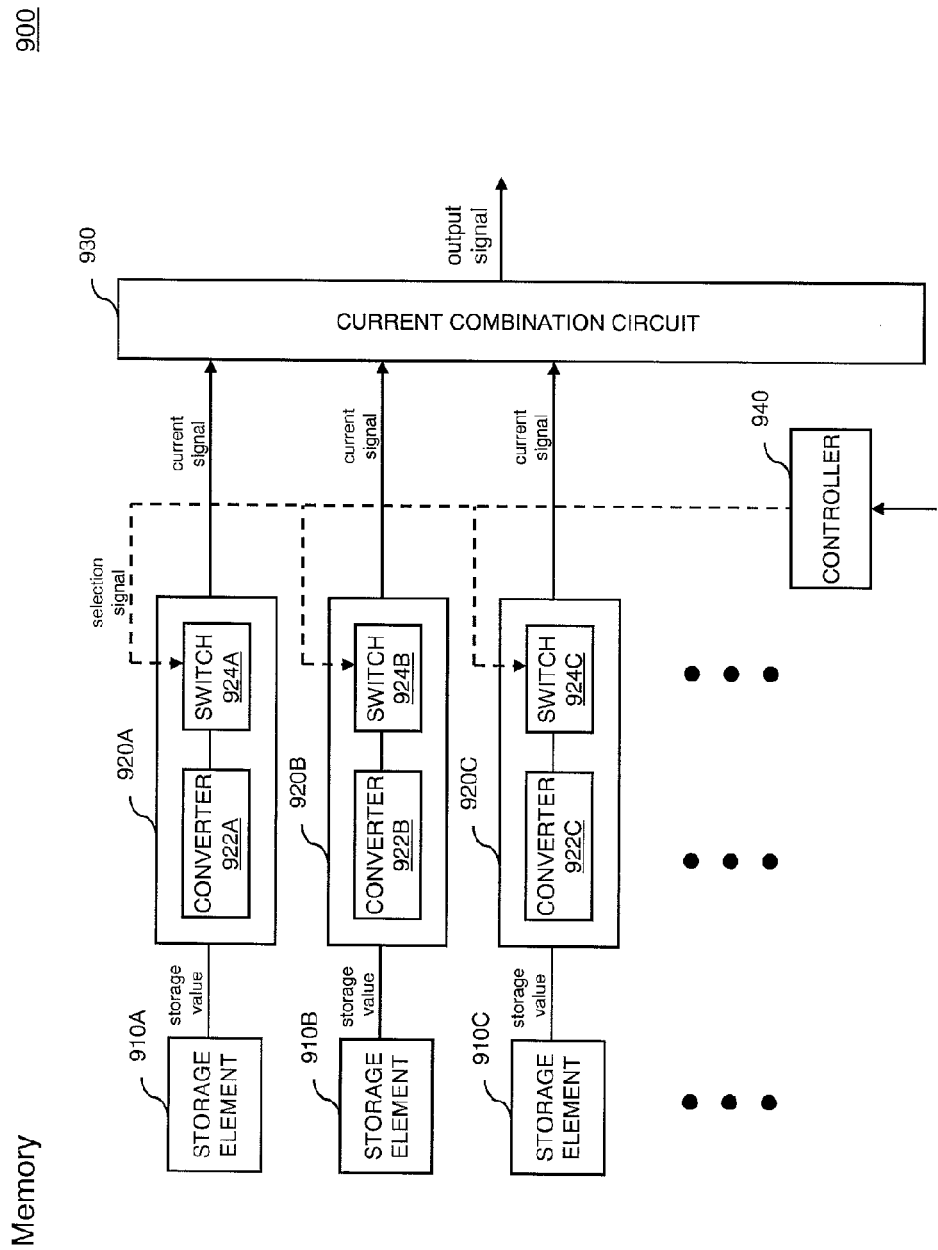
FIG. 7 is a block diagram of a memory.

FIG. 7 shows one example of a memory device 900 coupled with a soft Equals gate for retrieving storage values. The memory device 900 includes a set of storage elements such as 910A-C each configured for carrying a respective storage value. The storage elements may be capacitive elements (e.g., capacitors) or other type of energy storage elements (e.g., electro-magnetic elements). Each storage element may be configured to be a memory cell. In some applications, the memory cells store analog values that represent the messages going between soft logical gates as part of a belief propagation computation. Further discussion of this application is provided in U.S. Provisional Patent Application Ser. No. 61/293,999, titled "Belief Propagation Processor," filed Jan. 11, 2010, and U.S. Provisional Patent Application Ser. No. 61/156,721, titled "Belief Propagation Processor," filed Mar. 2, 2009.

To retrieve the storage value in a selected storage element 910, a conversion element 920 is configured to convert the corresponding storage value to a current signal. Subsequently, the current signals representing the storage values of the selected storage elements are combined (e.g., summed) by a current combination circuit 930 (e.g., circuit including a common bus) to generate an output signal, which is effectively a soft Equal output of the selected storage values.

In some examples, each of the conversion element 920 includes a converter 920 (e.g., a transistor-based converter for transforming an electrical charge to a current signal) and a switch 924 for coupling the current signal to the current combination circuit 930. Each switch 924 may be further configured to be responsive to external control, for example, a selection signal provided by a controller 940 that specifies the physical addresses of the subset of storage elements 910 to be accessed in each read operation.

In some examples, the controller 940 may be configured to receive, in each read operation, a specification of a selected subset of storage elements to generate the selection signals to active the corresponding switches such that the current signals representing the storage values of the selected storage elements undergo the soft Equals operation. In some examples, the memory device may be arranged into sub-sets of memory cells, for example, each subset residing in a distinct physical region and being coupled to a respective common bus that can perform the soft Equals operation on the readout values of the subset of memory cells. Or in other words, the subset of memory cells that need to be fed to the same soft Equals gate will be coupled to a shared hardware (e.g., a common bus). In such cases, the controller 940 may have a subset identifier that, in each read operation, directs to a predefined range of physical addresses of the corresponding subset of memory cells that provide inputs to a common soft Equals gate.

Note that, in contrast to some traditional memory architectures where each memory value needs to be retrieved on a separate output line of the memory and then sent to separate Equals gates, in the present approach, the input stage of the soft Equals gates is incorporated into the memory to allow storage values of subsets of memories cells be retrieved via shared hardware components (e.g., common buses). For example, instead of having 8 individual wires respectively coupled to 8 memory cells to deliver current signals that need to be fed into to an 8-input Equals gate, the current signals from the 8 memory cells may be summed onto a single wire that effectively soft Equals the storage values to generate one output signal to be processed in a succeeding circuit (e.g., a soft XOR gate). As currents from many wires can be combined into one wire, less power will be consumed by memory access because fewer wires will need to be driven.

Figure 8:
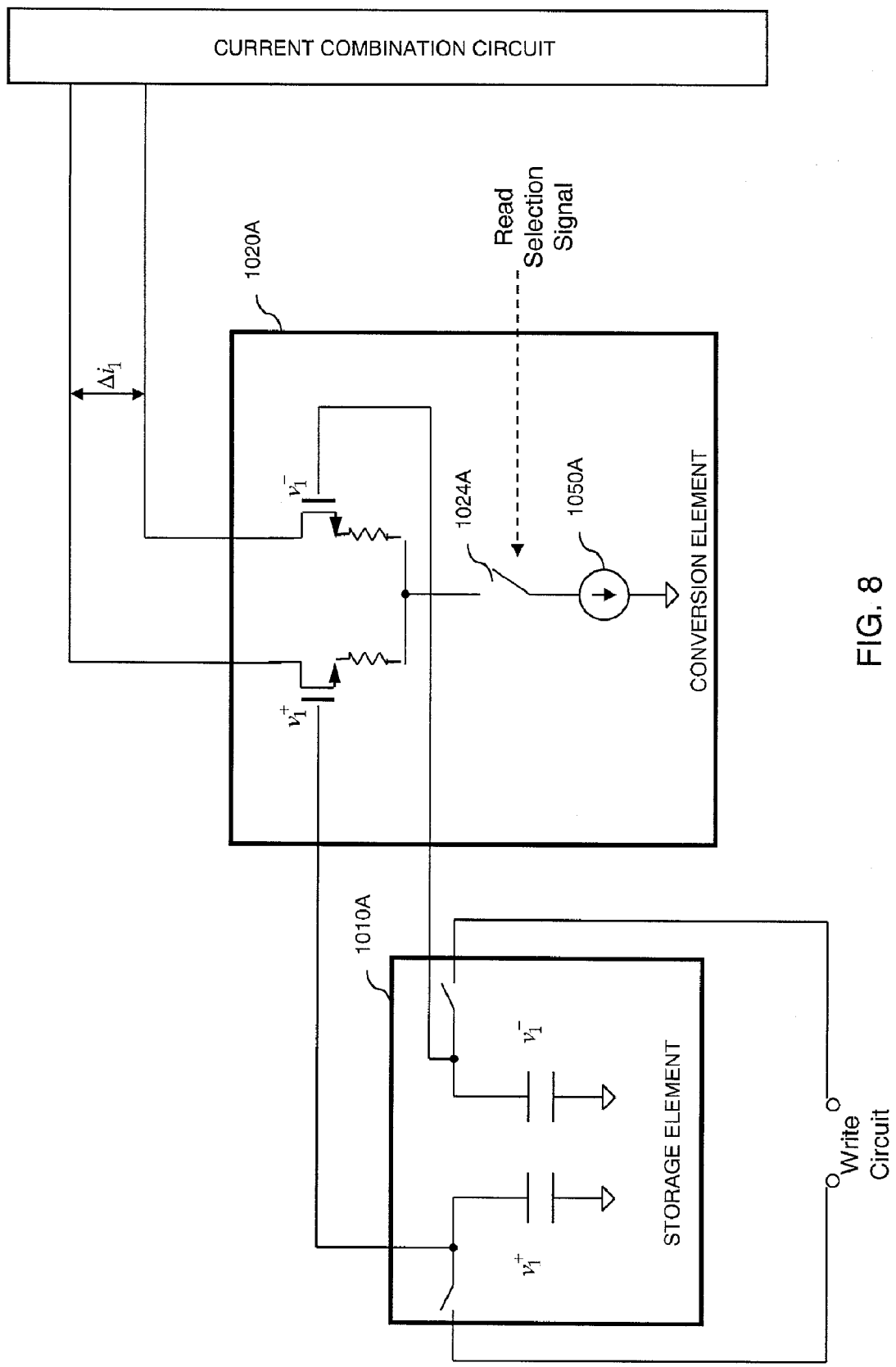
FIG. 8 is a schematic circuit diagram of one embodiment of the memory of FIG. 7.

FIG. 8 shows a detailed circuit diagram of one example of the memory cell 900. In this example, each storage element 1010A includes a pair of capacitors that carry storage values represented by differential voltages (or charges). The conversion element 1020A includes a differential amplifier switchably coupled to a current source 1050. To read the storage value, a "read selection signal" activates the switch 1024A to couple the current source 1050A to the differential amplifier, which then converts the differential voltage representing the storage value into a differential current signal $\Delta i_1$. The differential current signal is provided to the current combination circuit to be combined (e.g., summed) with other differential current signals to generate an output that is effective a soft Equals function of the selected storage values.

4.2 Error Correction Decoder

Another application relates to soft error correction decoding, where the soft gates described herein may be used to perform functions that mirror the digital gates used in a digital decoder. Some examples of soft gates in error correction decoding is described in U.S. Patent Provisional Application Ser. No. 61/156,721, titled "Signal Mapping," and in U.S. Provisional Patent Application Ser. No. 61/293,999, titled "Belief Propagation Processor." The contents of the above application are incorporated herein by reference.

5 Alternative Embodiments

In this description, the circuit examples are illustrated as being configured to process input and output signals in the differential form. Note that circuits that process single-ended signals are also possible. In some applications, it may be useful to adopt differential signals in circuit design over single-ended signals. Advantages of differential signals may include, for example, a larger dynamic range for circuit operation and higher noise immunity (such as common mode rejection). For instance, if a constant noise is introduced to both wires of the differential input (or output), it is possible to design gate circuits that will ignore this constant additive factor and will only respond to the difference (the first order) between the signals on the two wires.

In some applications, it is useful for the same representation (e.g., the LLR representation) to be used for inputs and outputs of every gate in a soft-inference processor (e.g., a soft decoder) without having to transform signals between different representations. In some other applications, it is also possible for a gate circuit to take its input in one representation (e.g., in linear probability), and produce its output in another (e.g., in LLR). In some decoders that are configured based on bipartite graphs (e.g., a soft Equals gate always feeds a soft XOR gate and vice versa), when a soft Equals gate that transforms from one representation to another (e.g., from probability to LLR) is matched with a soft XOR gate (or other constraint gate) that conducts the reverse transformation (e.g., from LLR to probability), the decoders would still perform the correct sequence of operations. This is also applicable to other factor-graph based inference processors besides decoders, and other soft gates besides soft Equals and soft XOR gates as long as there is a consistent representation at each point in the graph.

In some embodiments, there are non-linearities associated with the circuits that feed the soft gates, and other non-ideal characteristics of the circuits. As a result, the representation at each input/output terminal may not necessarily be exactly LLR representations. For example, at the input to a decoder (e.g., signal generated by a demapper circuit), a slight variation of the LLR representation may be used. For example, a slightly non-linear mapping from LLR to voltage signals may perform better by compensating to some extent to the circuit non-idealities.

The soft gates described above may be used in statistical inference applications where information needs to be extracted from an observation of data that has been distorted in some way. It may also be useful in applications where information is not certain due to incomplete data sets. It may also be useful in applications where differential information needs to be weighted by its relevance or statistical significance, for example, as in medical diagnosis.

It is to be understood that the foregoing description is intended to illustrate and not to limit the scope of the invention, which is defined by the scope of the appended claims. Other embodiments are within the scope of the following claims.

What is claimed is:

1. A circuit implementing a soft logical processing network comprising an interconnection of analog processing elements including soft logic gates, the soft logic gates comprising one or more soft logic gates, each soft logic gate comprising:
   a plurality of circuit parts, each part including
   an input configured to accept a voltage signal representation of a soft logical quantity, and
   a conversion section configured to use the accepted voltage representation form a current signal that depends on the soft logical quantity;
   wherein in at least a first circuit part of the plurality of circuit parts, the conversion section is configured to convert the accepted voltage representation to provide a corresponding current signal representation of the soft logical quantity; and
   wherein in at least a second circuit part of the plurality of circuit parts, the conversion section is configured to combine the accepted voltage representation and the current signal representation provided by another of the circuit parts to provide a current signal representation; and
   wherein the soft logic gate further comprises a signal combination part coupled to the conversion section of one or more of the circuit parts to form a current signal representation of an output of the soft logic gate.

2. The circuit of claim 1 wherein the voltage signal representations each comprise a substantially log based representation of a corresponding probability value.

3. The circuit of claim 1 wherein the voltage signal representations each comprise a substantially log based representation of a likelihood ratio value.

4. The circuit of claim 1 wherein the output of the soft logic gate includes an XOR function of the soft logical quantity.

5. The circuit of claim 1 wherein at least one of the soft logic gates is configured to implement a soft XOR gate.

6. The circuit of claim 1 wherein in each circuit part, the input is configured to receive a differential voltage signal representation of the soft logical quantity on a plurality of signal lines.

7. The circuit of claim 6 wherein each signal line is coupled to a corresponding transistor in the conversion section configured to operate in an above threshold mode.

8. The circuit of claim 6 wherein the transistors of the first circuit part are configured to provide a differential current that is substantially proportional to the soft logical quantity represented in the received differential voltage signal.

9. The circuit of claim 8 wherein the transistors of the second circuit part are configured to provide a differential current that is substantially proportional to a product of the soft logical quantity represented in the received differential voltage signal and a quantity represented by the current signal provided by the another of the circuit parts.

10. The circuit of claim 9 wherein the signal combination part is configured to form a current signal representation substantially proportional to a product of the accepted soft logical quantities, whereby the logic gate implements a soft XOR function.

11. The circuit of claim 1 wherein the conversion sections each comprises a differential amplifier.

12. The circuit of claim 11 wherein at least some of the differential amplifiers each includes a configurable resistive element that controls a characteristic of the differential amplifier.

* * * * *